United States Patent
Sharma et al.

(10) Patent No.: US 10,325,042 B1
(45) Date of Patent: Jun. 18, 2019

(54) DEBUGGING FAILURES IN X-PROPAGATION LOGIC CIRCUIT SIMULATION

(71) Applicant: Cadence Design Systems, Inc., San Jose, CA (US)

(72) Inventors: Amit Sharma, Noida (IN); Amit Aggarwal, Ghaziabad (IN); Amit Dua, Fremont, CA (US); Manu Chopra, New Delhi (IN); Vincent Reynolds, Maidenhead (GB); Abhishek Raheja, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 307 days.

(21) Appl. No.: 15/247,798

(22) Filed: Aug. 25, 2016

(51) Int. Cl.
    G06F 17/50      (2006.01)

(52) U.S. Cl.
    CPC .................. *G06F 17/5022* (2013.01)

(58) Field of Classification Search
    None
    See application file for complete search history.

*Primary Examiner* — Vuthe Siek
*Assistant Examiner* — Aric Lin
(74) *Attorney, Agent, or Firm* — McDermott Will & Emery LLP

(57) ABSTRACT

Methods for debugging a failure in a logic circuit design simulation by tracing a X-value are provided. In one aspect, a method includes detecting during a X-propagation logic circuit design simulation a failure at a register transfer level of a logic circuit comprising one or more logic blocks and tracing a X-value in a data path of the one or more logic blocks until the X-value is observed in a control path of the one or more logic blocks. The method also includes identifying a logic block comprising a control signal of the control path in which the X-value is observed, and identifying the logic block in which the X-value is observed as a root cause of the failure. Systems and machine-readable media are also provided.

8 Claims, 6 Drawing Sheets

DEBUGGING FAILURES IN X-PROPAGATION LOGIC CIRCUIT SIMULATION

TECHNICAL FIELD

The present disclosure generally relates to circuit design simulations, and more specifically relates to debugging failures in circuit design simulation.

BACKGROUND

X-values in circuit design simulations represent unknown signal values, such as "don't care" values or "wildcard" values. These different interpretations of the X-values may cause different behaviors in physical circuits and simulations. Additionally, standard hardware description language (HDL) simulation semantics conceal X-value related bugs (X-bugs) in simulation as these X-values may not be propagated in certain scenarios. These X-bugs are generally uncovered during gate level simulation, which comes late in a circuit designing cycle and causes added cost in fixing the X-bugs. However, with the use of X-propagation in simulation, X-bugs can be detected at a register transfer level (RTL), which comes before gate level simulation. Although X-bugs are commonly detected at an earlier state of the circuit designing cycle, identifying the failure point of the X-bugs can be a cumbersome and time consuming process.

The description provided in the background section should not be assumed to be prior art merely because it is mentioned in or associated with the background section. The background section may include information that describes one or more aspects of the subject technology.

SUMMARY

The disclosed method provides for debugging a failure in a logic circuit design when a failure is detected at a register transfer level of a logic circuit in a X-propagation logic circuit simulation. The method further provides for tracing a X-value through a data path of the logic circuit until the X-value is observed in a control path of the logic circuit.

According to certain aspects of the present disclosure, a computer-implemented method for debugging a failure in a logic circuit design simulation by tracing a X-value is provided. The method includes detecting during a X-propagation logic circuit design simulation a failure at a register transfer level of a logic circuit including one or more logic blocks, and tracing a X-value in a data path of the one or more logic blocks until the X-value is observed in a control path of the one or more logic blocks. The method further includes identifying, from the one or more logic blocks, a logic block including a control signal of the control path in which the X-value is observed, and identifying the logic block in which the X-value is observed as a root cause of the failure.

According to certain aspects of the present disclosure, a computer-implemented method for debugging a failure in a logic circuit design simulation by iterating the simulation is provided. The method includes detecting during a X-propagation logic circuit design simulation a failure at a register transfer level, and iterating the X-propagation logic circuit design simulation, wherein an X-propagation is enabled in the X-propagation logic circuit design simulation at a different time for each iteration. The method further includes identifying a first time when the X-propagation is enabled and the X-propagation logic circuit design simulation fails, identifying a second time when the X-propagation is enabled and the X-propagation logic circuit design simulation succeeds, and determining a time window in which the X-propagation logic circuit design simulation fails based on the first time and the second time. The method also includes generating a first waveform of the X-propagation logic circuit design simulation, generating a second waveform of a non-X-propagation logic circuit design simulation, and comparing the first waveform and the second waveform during the determined time window. The method further includes determining a first point where the first waveform differs from the second waveform, and identifying a logic block that corresponds to the first point as a root cause of the detected failure in the X-propagation logic circuit design simulation.

According to certain aspects of the present disclosure, a non-transitory computer machine-readable storage medium including machine-readable instructions for causing one or more processor to executed a method for debugging a failure in a logic circuit design simulation by tracing a X-value is provided. The method includes detecting during a X-propagation logic circuit design simulation a failure at a register transfer level of a logic circuit including one or more logic blocks, tracing a X-value in a data path of the one or more logic blocks by examining data in each of the one or more logic blocks, and terminating the tracing of the X-value in the data path when the X-value is observed in a control signal of the one or more logic blocks. The method also includes identifying, from the one or more logic blocks, a logic block that includes the X-value in both the data and the control signal and generating a waveform of a non-X-propagation logic circuit design simulation. The method further includes determining whether the waveform indicates that the control signal of the identified logic block includes the X-value, and in response to the determination that the waveform indicates that the control signal of the identified logic block includes the X-value, identifying the logic block as a root cause of the failure.

According to certain aspects of the present disclosure, a system for debugging a failure in a logic circuit design simulation by tracing a X-value is provided. The system includes means for detecting during a X-propagation logic circuit design simulation a failure at a register transfer level of a logic circuit including one or more logic blocks. The system further includes means for tracing a X-value in a data path of the one or more logic blocks until the X-value is observed in a control path of the one or more logic blocks, identifying, from the one or more logic blocks, a logic block including a control signal of the control path in which the X-value is observed, and identifying the logic block in which the X-value is observed as a root cause of the failure.

According to certain aspects of the present disclosure, a system for debugging a failure in a logic circuit design simulation by iterating the simulation is provided. The system includes means for detecting during a X-propagation logic circuit design simulation a failure at a register transfer level and iterating the X-propagation logic circuit design simulation, wherein an X-propagation is enabled in the X-propagation logic circuit design simulation at a different time for each iteration. The system also includes means for identifying a first time when the X-propagation is enabled and the X-propagation logic circuit design simulation fails, identifying a second time when the X-propagation is enabled and the X-propagation logic circuit design simulation succeeds, and determining a time window in which the X-propagation logic circuit design simulation fails based on the first time and the second time. The system further includes means for generating a first waveform of the X-propagation logic circuit design simulation, generating a second waveform of a non-X-propagation logic circuit design simulation, comparing the first waveform and the second waveform during the determined time window, determining a first point where the first waveform differs from the second waveform, and identifying a logic block that corresponds to the first point as a root cause of the detected failure in the X-propagation logic circuit design simulation.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The disclosed system provides for debugging a failure in a logic circuit design simulation. The failure is debugged by identifying a logic block in the logic circuit that includes a X-value in its control signal as a root cause of the failure. The disclosed system addresses a technical problem tied to logic circuit design verification in the realm of a logic circuit design simulation, namely the technical problem of hidden root causes of failures in logic circuit design simulation. The disclosed system solves this technical problem by identifying the root cause of the failure through determining a logic block that includes the problematic control signal.

Example System Architecture

Figure 1:
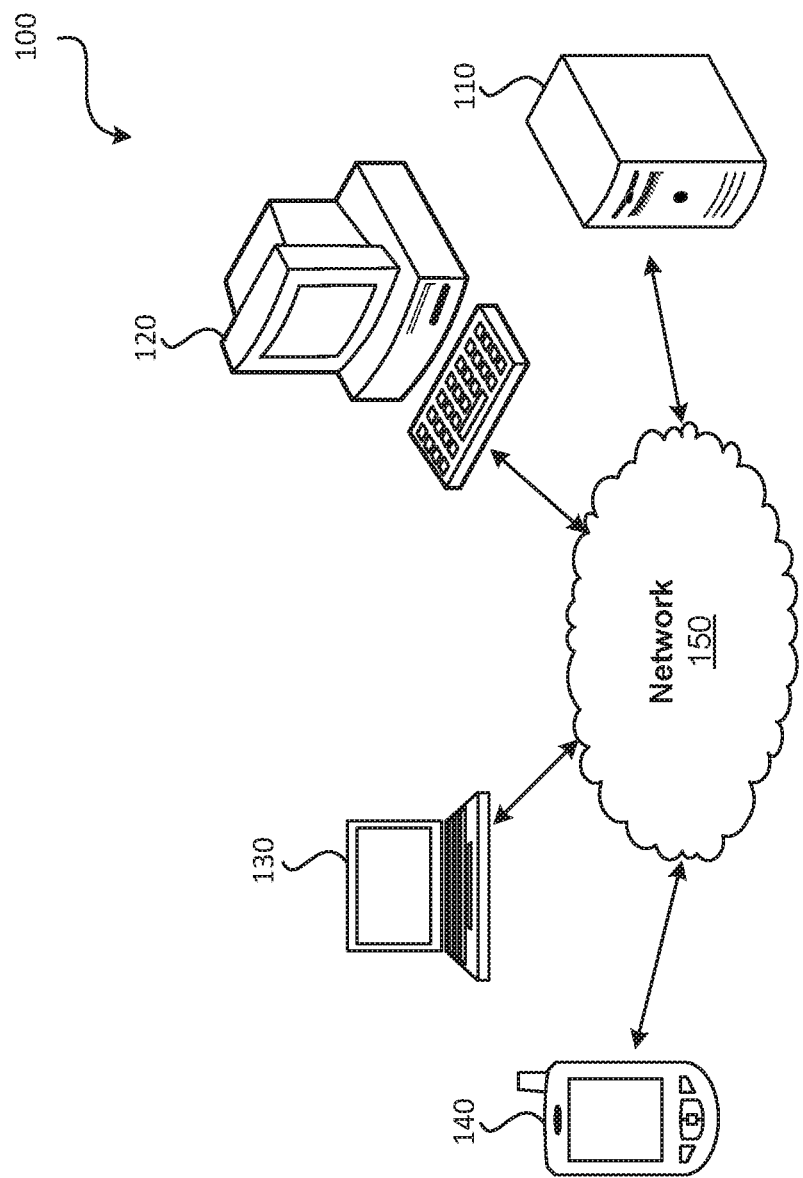
FIG. 1 illustrates an example architecture for debugging a failure in a logic circuit design simulation.

FIG. 1 illustrates an example architecture 100 for debugging a failure in a logic circuit design simulation. The architecture 100 includes a server 110, a computing device (e.g., a workstation) 120, a mobile computer 130, and a mobile device (e.g., a smartphone or PDA) 140. The server 110 can be any device or a web server for hosting an electronic design automation (EDA) application and an electronic (e.g., logic circuit) design verification service. The workstation 120, the mobile computer 130, and the mobile device 140 each includes an EDA client application. The user of the workstation 120, the mobile computer 130, or the mobile device 140 may access the EDA application on the server 110 through the EDA client application on the user's device to design, for example, logic circuits or integrated circuits. In some aspects, the EDA application and the logic circuit design verification service reside on the workstation 120, the mobile computer 130, or the mobile device 140. The user may access the EDA application and the logic circuit design verification service on the workstation 120, the mobile computer 130, or the mobile device 140.

A logic circuit includes one or more logic blocks. The one or more logic blocks may represent, for example, one or more combinational logics, one or more sequential logics (e.g., flip-flops), or any combinations of both. When a logic circuit is digitally designed in the EDA application, the logic circuit design is simulated using the verification service to verify whether the logic circuit design behaves as the user intended. If the simulation fails during the verification, the verification service debugs the failure by identifying the root cause of the failure.

In some aspects, the verification service utilizes at least a X-propagation logic circuit simulation (hereinafter referred to as "X-propagation simulation") and a non-X-propagation logic circuit simulation (hereinafter referred to as "non-X-propagation simulation") to simulate a logic circuit design. In a X-propagation simulation, a X-propagation function is enabled and an unknown value (e.g., a X-value) is propagated. On the other hand, in a non-X-propagation simulation, a X-propagation function is disabled and a X-value is not propagated.

In some aspects, the verification service includes one or more simulators for simulating a logic circuit design and for detecting a failure in the simulation. The verification service may further include one or more tracing devices for tracing a X-value through one or more logic blocks, identifying a control signal that includes the X-value, and identifying the logic block that is associated with the identified control signal.

In some other aspects, the verification service also includes one or more simulators for simulating a logic circuit design and for detection a failure in the simulation. The verification service may also include a timer that identifies a first time associated with the occurrence of the failure in the simulation and a second time associated with the success in the simulation after the failure and determining a time window from the first and second time. The verification service may further include a waveform generator for generating waveforms of the logic circuit design, comparing the waveforms to determine the point of failure, and identifying a logic block that corresponds to the failure point as a root cause.

The entities of the architecture 100 are connected via a network 150. The network 150 can include, for example, any one or more of a personal area network (PAN), a local area network (LAN), a campus area network (CAN), a metropolitan area network (MAN), a wide area network (WAN), a broadband network (BBN), the Internet, and the like. Further, the network 150 can include, but is not limited to, any one or more of the following network topologies, including a bus network, a star network, a ring network, a mesh network, a star-bus network, a tree or hierarchical network, and the like.

Figure 2:
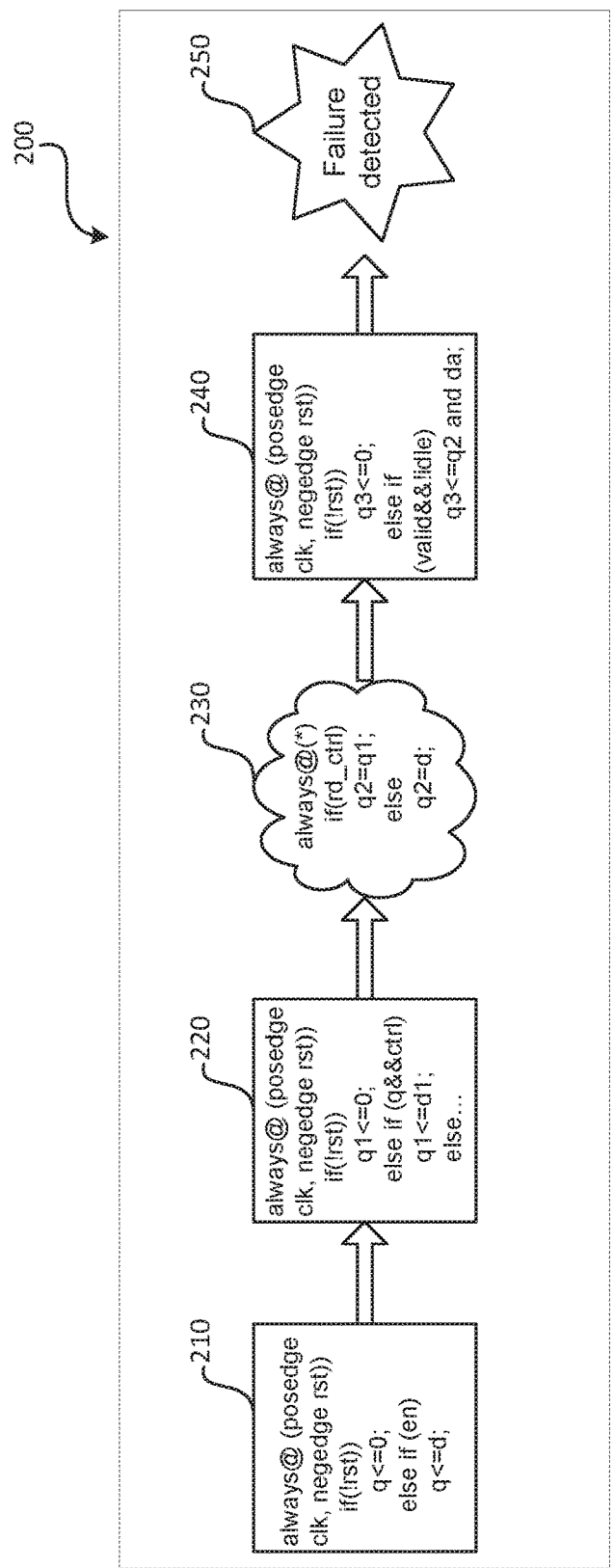
FIG. 2 illustrates an example chain in a X-propagation logic circuit simulation according to certain aspects of the disclosure.

FIG. 2 illustrates an example chain 200 in a X-propagation logic circuit simulation according to certain aspects of the disclosure. The chain 200 represents at least a portion of logic blocks of a logic circuit being verified by the verification service. The chain 200 includes logic blocks 210, 220, 230, and 240. However, in some aspects, the chain 200 may include less or more logic blocks than illustrated in FIG. 2. The chain 200 further includes a control path and a data path. The control path includes one or more control signals, and the data path includes one or more data signals.

The logic block 210 includes an example control signal "en" and an example data signal in which "q" equals "d". The output of the logic block 210 is fed to the logic block 220. The logic block 220 includes an example control signal "q&&ctrl", which is based on the output of the logic block 210, and an example data signal in which "q1" equals "d1". The output of the logic block 220 is fed into the logic block 230. The logic block 230 includes an example control signal "rd ctrl" and an example data signal in which "q2" equals "q1". The output of the logic block 230 is fed into the logic block 240. The logic block 240 includes an example control signal "valid &&!idle" and a data signal in which "q3" equals "q2". However, after the logic block 240, the X-propagation simulation fails. The verification service detects the failure in the X-propagation simulation.

Figure 3:
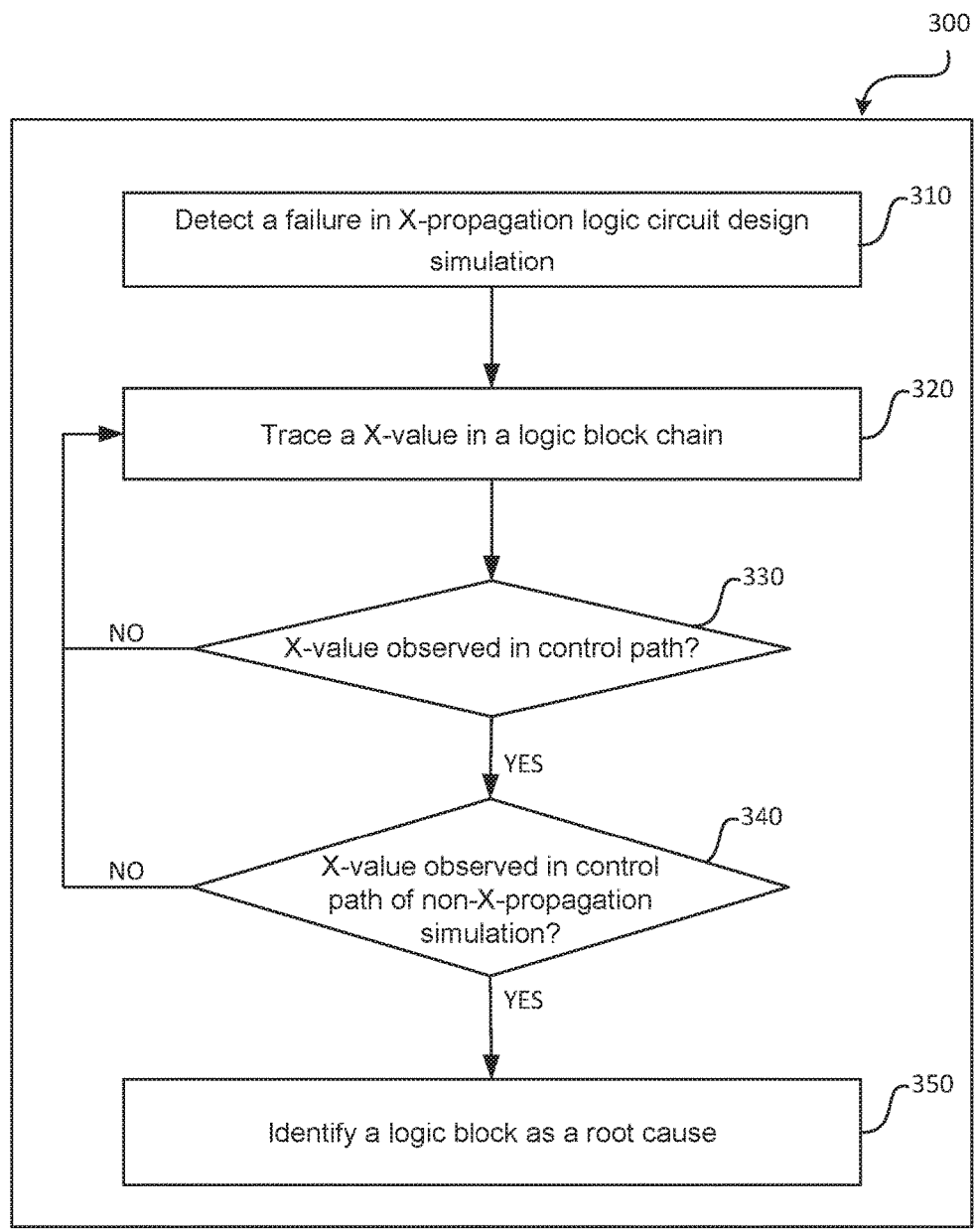
FIG. 3 illustrates an example process for debugging a failure in a logic circuit simulation according to certain aspects of the disclosure.

FIG. 3 illustrates an example process 300 for debugging a failure in a logic circuit simulation according to certain aspects of the disclosure. The process 300 is implemented by the verification service on the server 110. The process 300 begins when a failure is detected in a X-propagation simulation in stage 310.

In some aspects, the type of the failure detected in the X-propagation logic circuit design simulation is determined. The type of failure may be one or more of, but limited to, a X-assertion failure, a scoreboard failure, and a misbehavior of simulation. Misbehaviors of simulations are, for example, hanging or taking a different path than the expected path. In some aspects, the remaining stages of the process 300 are executed if the type of the failure is determined to be a X-assertion failure.

After a failure is detected in a X-propagation simulation, the process 300 proceeds to stage 320 where a X-value is traced through one or more data signals in a logic block chain of the X-propagation simulation. Then in stage 330, whether the X-value is observed in a control signal in the logic block chain of the X-propagation simulation is determined. If the X-value is observed in the control signal of the X-propagation simulation (330=YES), the process 300 proceeds to stage 340. Otherwise, if the X-value is not observed in the control signal of the X-propagation simulation (330=NO), the process returns to stage 320.

In stage 340, whether the X-value is also observed in a control signal in a logic block chain of a non-X-propagation simulation is determined. Of the X-value is observed in the control signal of the non-X-propagation simulation (340=YES), the process proceeds to 350 where a logic block that includes the control signal in which the X-value was observed is identified as a root cause of the failure. Otherwise, if the X-value is not observed in the control signal of the non-X-propagation simulation (340=NO), the process returns to stage 320. The logic block may be confirmed to be the root cause of the failure by determining whether a waveform of a non-X-propagation simulation indicates that the control signal that corresponds to the logic block includes the X-value.

Referring back to FIG. 2, a failure is detected after the logic block 240. The verification service traces the X-value in the data path of the chain 200 by checking the data signal of the logic block 240. The verification service determines whether the X-value is observed in the control signal of the logic block 240. However, because the X-value is not observed in the control signal of the logic block 240, the verification service further traces the data path of the chain 200 by checking the data signal of the logic block 230. However, the X-value is not observed in the control signal of the logic block 230. The verification service moves onto checking the X-value in the data signal of the logic block 220. This time, the X-value is observed in the control signal (e.g., a signal "q" in the control signal "q&&ctrl") of the logic block 220. Then, whether the X-value is also observed in the control signal of the logic block 220 in the non-X-propagation simulation is determined. However, the signal "q" is non-X-value in the logic blocks in non-X-propagation simulation. Thus, the verification service continues to trace the X-value in the chain 200.

Because the X-value was not observed in the control signal in both of the X-propagation simulation and the non-X-propagation simulation, the data signal of the logic block 210 is checked for the X-value. The X-value is observed in the control signal (e.g., a signal "en" in the control signal "en") of the logic block 210. The verification service again determines whether the X-value is also observed in the control signal of the logic block 210 in the non-X-propagation simulation. This time, the signal "en" is determined to be a X-value in the non-X-propagation simulation. Therefore, the verification service identifies the logic block 210 as a root cause of the failure in the X-propagation simulation.

The information regarding the logic block identified as the root cause may be displayed on a display of the workstation 120, the mobile computer 130, or the mobile device 140.

Figure 4:
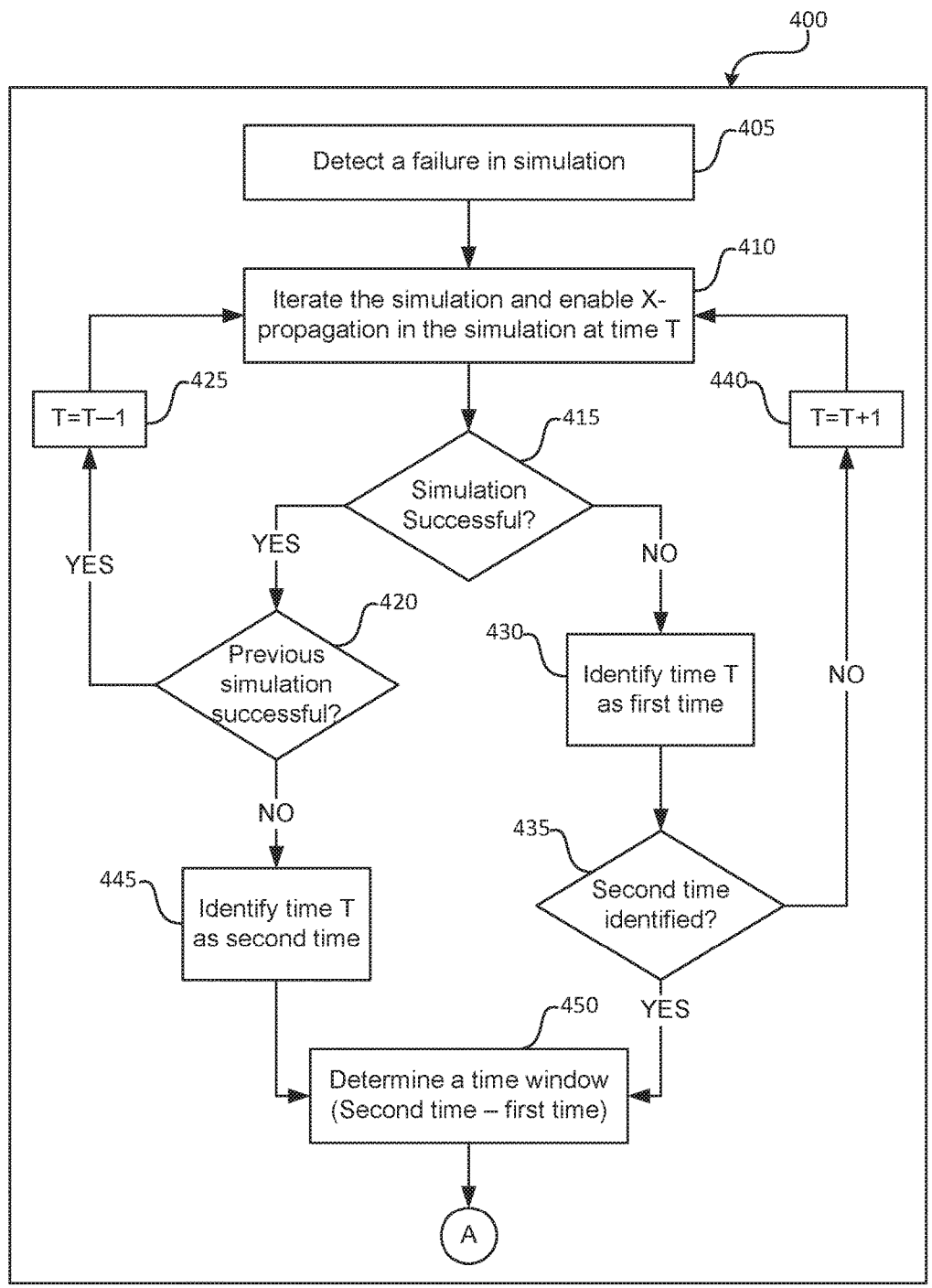
FIG. 4 is a flow diagram illustrating an example debugging flow according to certain aspects of the disclosure.

FIG. 4 is a flow diagram illustrating an example debugging flow 400 according to certain aspects of the disclosure. The debugging flow 400 is implemented by the verification service in the server 110. The debugging flow 400 begins when the verification service encounters a failure during a X-propagation simulation. The failure is detected in the X-propagation simulation in stage 405. The failure may be detected, for example, if the X-propagation simulation hangs or crashes.

In stage 410, the simulation is iterated by enabling the function of X-propagation in the simulation at time T (e.g., at 20 picoseconds, 1 microsecond). Whether the iterated simulation is successful is determined in stage 415. If the simulation is successful (415=YES), the flow 400 proceeds to stage 420. Otherwise, if the simulation fails (415=NO), the flow 400 moves to stage 430 where the time T is identified as a first time. In stage 435, whether a second time is identified is determined. If the second time is already identified (435=YES), the flow 400 proceeds to stage 450. Otherwise, if the second time is not identified yet (435=NO), the flow 400 proceeds to stage 440 where the time T is incremented by a predetermined period of time (e.g., by 15 picoseconds) and returns to stage 410.

After the iterated simulation is determined to be successful, whether the previously iterated simulation was successful is determined in stage 420. If the previously iterated simulation was successful (420=YES) or there is no previously iterated simulation, the flow proceeds to stage 425 where the time T is decremented by a predetermined period of time (e.g., by 10 picoseconds, 1 microsecond) and returns to stage 410. Otherwise, if the previously iterated simulation failed (420=NO), the flow proceeds to stage 445 where the time T is identified as second time and the flow proceeds to stage 450.

In stage 450, a time window in which the failure was detected is determined, for example, by finding a difference between the first time and the second time. The flow proceeds to "A" in FIG. 5.

Figure 5:
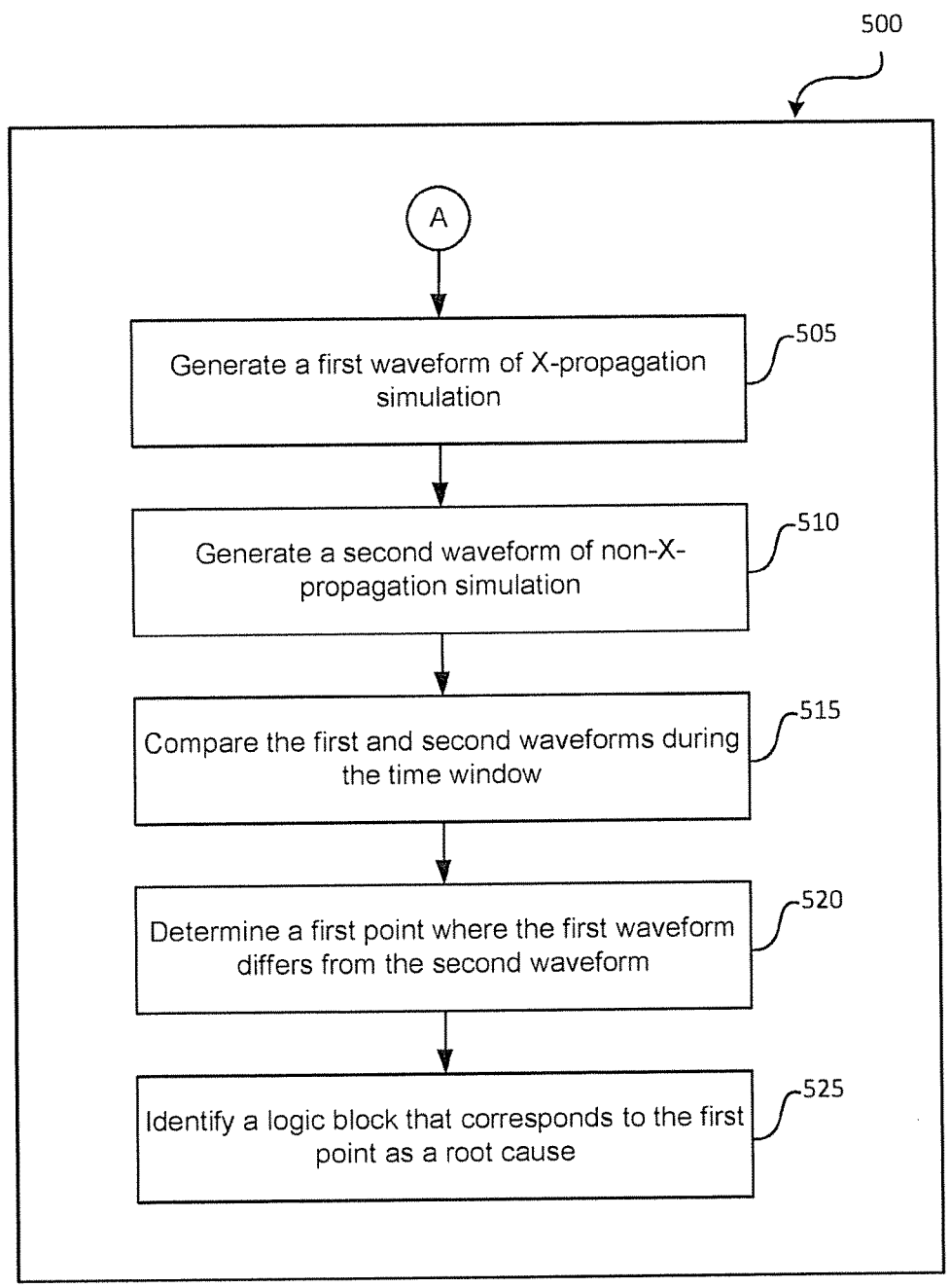
FIG. 5 is a flow diagram illustrating another example debugging flow according to certain aspects of the disclosure.

FIG. 5 is a flow diagram illustrating an example debugging flow 500 according to certain aspects of the disclosure. The flow 500 starts after the time window in which the failure was detected is determined in stage 450 of FIG. 4. In stage 505, a first waveform of the X-propagation simulation is generated. Next, in stage 510, a second waveform of a non-X-propagation simulation is generated. The first waveform and the second waveform represent the control signals and data signals of logic blocks. The first waveform and the second waveform during the determined time window are compared in stage 515. Then in stage 520, a first point where the first waveform differs from the second waveform is determined. Finally, in stage 525, a logic block that corresponds to the first point is identified as a root cause of the failure.

In some aspects, a control signal that includes a root cause of the failure can be identified from the comparison of the first and second waveforms. In one or more aspects, the logic block identified as a root cause can also be based on the identified control signal.

Hardware Overview

Figure 6:
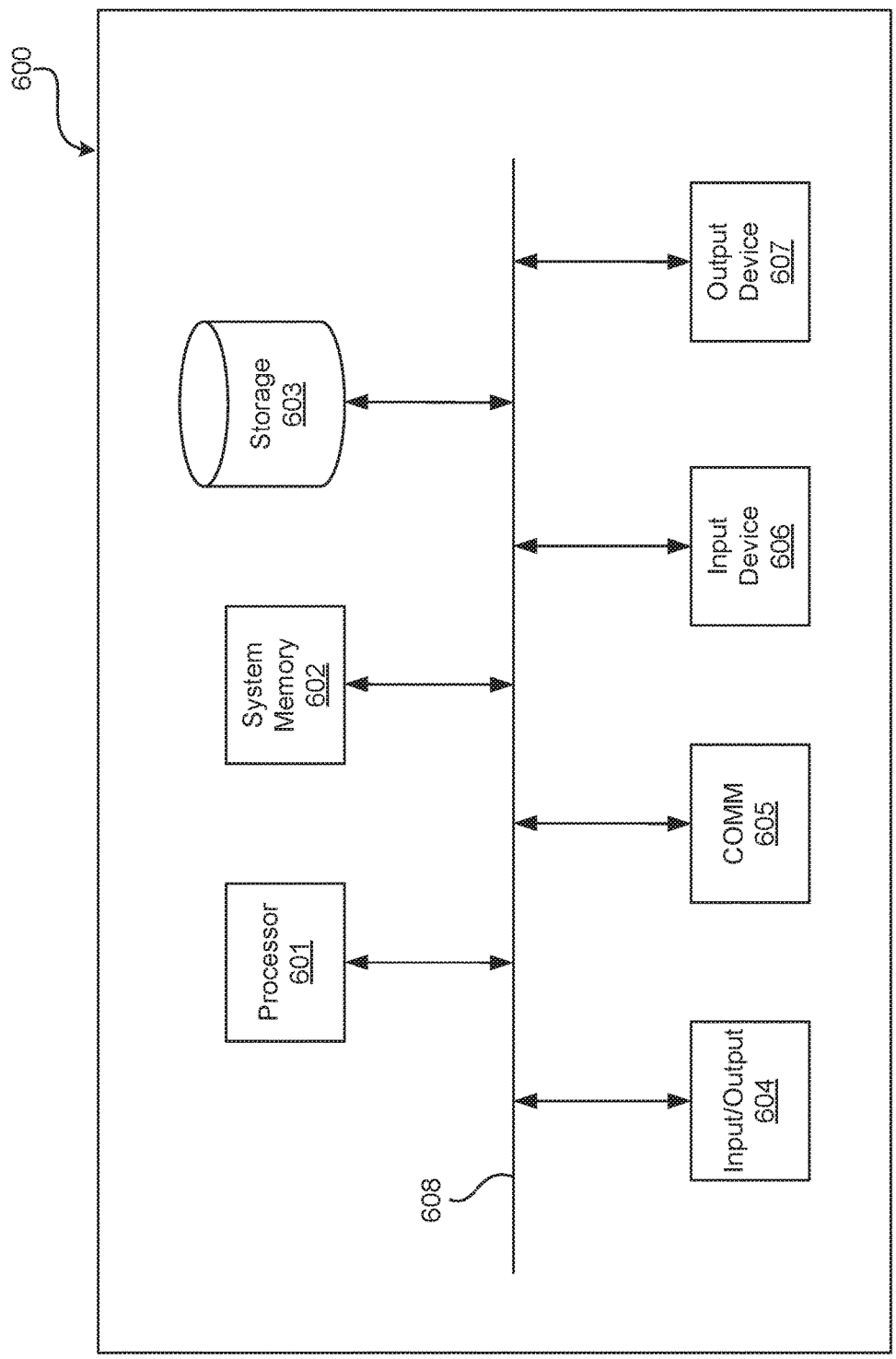
FIG. 6 is a block diagram illustrating an example computer system with which the debugging a failure in a logic circuit design simulation can be implemented.

FIG. 6 is a block diagram illustrating an example computer system 600 with which debugging a failure in a logic circuit design simulation can be implemented. In some aspects, the computer system 600 may represent the server 110, the computing device 120, the mobile computer 130, and the mobile device 140 of FIG. 1. In certain aspects, the computer system 600 may be implemented using hardware or a combination of software and hardware, either in a dedicated server, or integrated into another entity, or distributed across multiple entities.

Computer system 600 (e.g., server 110, workstation 120, the mobile computer 130, the mobile device 140) includes a bus 608 or other communication mechanism for communicating information, and a processor 601 coupled with bus 608 for processing information. According to one aspect, the computer system 600 is implemented as one or more special-purpose computing devices. The special-purpose computing device may be hard-wired to perform the disclosed techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques. By way of example, the computer system 600 may be implemented with one or more processors 601. Processor 601 may be a general-purpose microprocessor, a microcontroller, a Digital Signal Processor (DSP), an ASIC, a FPGA, a Programmable Logic Device (PLD), a controller, a state machine, gated logic, discrete hardware components, or any other suitable entity that can perform calculations or other manipulations of information.

Computer system 600 can include, in addition to hardware, code that creates an execution environment for the computer program in question, e.g., code that constitutes processor firmware, a protocol stack, a database management system, an operating system, or a combination of one or more of them stored in an included memory 602, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 608 for storing information and instructions to be executed by processor 601. The processor 601 and the memory 602 can be supplemented by, or incorporated in, special purpose logic circuitry. Expansion memory may also be provided and connected to computer system 600 through input/output module 604, which may include, for example, a SIMM (Single In Line Memory Module) card interface. Such expansion memory may provide extra storage space for computer system 600, or may also store applications or other information for computer system 600. Specifically, expansion memory may include instructions to carry out or supplement the processes described above, and may include secure information also. Thus, for example, expansion memory may be provided as a security module for computer system 600, and may be programmed with instructions that permit secure use of computer system 600. In addition, secure applications may be provided via the SIMM cards, along with additional information, such as placing identifying information on the SIMM card in a non-hackable manner.

The instructions may be stored in the memory 602 and implemented in one or more computer program products, i.e., one or more modules of computer program instructions encoded on a computer readable medium for execution by, or to control the operation of, the computer system 600, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, with languages, embeddable languages, and xml-based languages. Memory 602 may also be used for storing temporary variable or other intermediate information during execution of instructions to be executed by processor 601.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 600 further includes a data storage device 603 such as a magnetic disk or optical disk, coupled to bus 608 for storing information and instructions. Computer system 600 may be coupled via input/output module 604 to various devices. The input/output module 604 can be any input/output module. Example input/output modules 604 include data ports such as USB ports. In addition, input/output module 604 may be provided in communication with processor 601, so as to enable near area communication of computer system 600 with other devices. The input/output module 604 may provide, for example, for wired communication in some implementations, or for wireless communication in other implementations, and multiple interfaces may also be used. The input/output module 604 is configured to connect to a communications module 605. Example communications modules 605 may include networking interface cards, such as Ethernet cards and modems.

The components of the system 600 can be interconnected by any form or medium of digital data communication, e.g., a communication network. The communication network (e.g., network 160 of FIG. 1) can include, for example, any one or more of a PAN, a LAN, a CAN, a MAN, a WAN, a BBN, the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

For example, in certain aspects, communications module 605 can provide a two-way data communication coupling to a network link that is connected to a local network. Wireless links and wireless communication may also be implemented. Wireless communication may be provided under various modes or protocols, such as GSM (Global System for Mobile Communications), Short Message Service (SMS), Enhanced Messaging Service (EMS), or Multimedia Messaging Service (MMS) messaging, CDMA (Code Division Multiple Access), Time division multiple access (TDMA), Personal Digital Cellular (PDC), Wideband CDMA, General Packet Radio Service (GPRS), or LTE (Long-Term Evolution), among others. Such communication may occur, for example, through a radio-frequency transceiver. In addition, short-range communication may occur, such as using a BLUETOOTH, WI-FI, near-field communications (NFC), or other such transceiver.

In any such implementation, communications module 605 sends and receives electrical, electromagnetic or optical signals that carry digital data streams representing various types of information. The network link typically provides data communication through one or more networks to other data devices. For example, the network link of the communications module 605 may provide a connection through local network to a host computer or to data equipment operated by an Internet Service Provider (ISP). The ISP in turn provides data communication services through the world wide packet data communication network now commonly referred to as the "Internet". The local network and Internet both use electrical, electromagnetic or optical signals that carry digital data streams. The signals through the various networks and the signals on the network link and through communications module 605, which carry the digital data to and from computer system 600, are example forms of transmission media.

Computer system 600 can send messages and receive data, including program code, through the network(s), the network link and communications module 605. In the Internet example, a server might transmit a requested code for an application program through Internet, the ISP, the local network and communications module 605. The received code may be executed by processor 601 as it is received, and/or stored in data storage 603 for later execution.

In certain aspects, the input/output module 604 is configured to connect to a plurality of devices, such as an input device 606 and/or an output device 607. Example input devices 606 include a keyboard and a pointing device, e.g., a mouse or a trackball, by which a user can provide input to the computer system 600. Other kinds of input devices 606 can be used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 607 include display devices, such as a LED (light emitting diode), CRT (cathode ray tube), LCD (liquid crystal display) screen, a TFT LCD (Thin-Film-Transistor Liquid Crystal Display) or an OLED (Organic Light Emitting Diode) display, for displaying information to the user. The output device 607 may comprise appropriate circuitry for driving the output device 607 to present graphical and other information to a user.

According to one aspect of the present disclosure, the server 110, the work station 120, mobile computer 130, and mobile device 140 can be implemented using a computer system 600 in response to processor 601 executing one or more sequences of one or more instructions contained in memory 602. Such instructions may be read into memory 602 from another machine-readable medium, such as data storage device 603. Execution of the sequences of instructions contained in main memory 602 causes processor 601 to perform the process steps described herein. One or more processors in a multi-processing arrangement may also be employed to execute the sequences of instructions contained in memory 602. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components.

Computing system 600 can include clients and servers. A client and server are generally remote from each other and typically interact through a communication network. The relationship of client and server arises by virtue of computer programs running on the respective computers and having a client-server relationship to each other. Computer system 600 can be, for example, and without limitation, a desktop computer, laptop computer, or tablet computer. Computer system 600 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer-readable medium" as used herein refers to any medium or media that participates in providing instructions or data to processor 601 for execution. The term "storage medium" as used herein refers to any non-transitory media that store data and/or instructions that cause a machine to operate in a specific fashion. Such a medium may take many forms, including, but not limited to, non-volatile media, volatile media, and transmission media. Non-volatile media include, for example, optical disks, magnetic disks, or flash memory, such as data storage device 603. Volatile media include dynamic memory, such as memory 602. Transmission media include coaxial cables, copper wire, and fiber optics, including the wires that comprise bus 608. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

As used in this specification of this application, the terms "computer-readable storage medium" and "computer-readable media" are entirely restricted to tangible, physical objects that store information in a form that is readable by a computer. These terms exclude any wireless signals, wired download signals, and any other ephemeral signals. Storage media is distinct from but may be used in conjunction with transmission media. Transmission media participates in transferring information between storage media. For example, transmission media includes coaxial cables, copper wire and fiber optics, including the wires that comprise bus 608. Transmission media can also take the form of acoustic or light waves, such as those generated during radio-wave and infra-red data communications. Furthermore, as used in this specification of this application, the terms "computer", "server", "processor", and "memory" all refer to electronic or other technological devices. These terms exclude people or groups of people. For the purposes of the specification, the terms display or displaying means displaying on an electronic device.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A computer-implemented method for debugging a failure in a logic circuit design simulation by tracing a X-value, the method comprising:
    detecting during a X-propagation logic circuit design simulation a failure at a register transfer level of a logic circuit comprising one or more logic blocks;
    tracing a X-value in a data path of the one or more logic blocks until the X-value is observed in a control path of the one or more logic blocks; and
    identifying, from the one or more logic blocks, a logic block comprising a control signal of the control path in which the X-value is identified as a root cause of the failure based on determining that a waveform of a non-X-propagation logic circuit design simulation indicates that the control signal includes the X-value.

2. The computer-implemented method of claim 1, wherein the X-value is traced sequentially from a logic block in which the failure is detected to one or more previous logic blocks that fed an input to the logic block in which the failure is detected.

3. The computer-implemented method of claim 1, further comprising displaying, at a graphical user interface, information regarding the logic block identified as the root cause of the failure.

4. The computer-implemented method of claim 1, further comprising determining a type of the failure.

5. The computer-implemented method of claim 4, further comprising tracing the X-value in the data path of the one or more logic blocks when the type of failure determined is one of a plurality of predetermined failure types.

6. The computer-implemented method of claim 1, the one of the plurality of predetermined failure types is a X assertion failure.

7. A non-transitory computer machine-readable storage medium comprising machine-readable instructions for causing one or more processor to executed a method for debugging a failure in a logic circuit design simulation by tracing a X-value, comprising:
    detecting during a X-propagation logic circuit design simulation a failure at a register transfer level of a logic circuit comprising one or more logic blocks;
    tracing a X-value in a data path of the one or more logic blocks by examining data in each of the one or more logic blocks;
    terminating the tracing of the X-value in the data path when the X-value is observed in a control signal of the one or more logic blocks;
    identifying, from the one or more logic blocks, a logic block that includes the X-value in both the data and the control signal;
    generating a waveform of a non-X-propagation logic circuit design simulation;
    determining whether the waveform indicates that the control signal of the identified logic block includes the X-value; and
    in response to the determination that the waveform indicates that the control signal of the identified logic block includes the X-value, identifying the logic block as a root cause of the failure.

8. The non-transitory computer machine-readable storage medium of claim 7, further comprising displaying, at a graphical user interface, information regarding the logic block identified as the root cause of the failure.

* * * * *